(12) United States Patent
Jeon et al.

(10) Patent No.: US 8,964,441 B2
(45) Date of Patent: Feb. 24, 2015

(54) SEMICONDUCTOR MEMORY DEVICE

(71) Applicant: SK Hynix Inc., Icheon (KR)

(72) Inventors: Seon Kwang Jeon, Icheon (KR); Sung Soo Ryu, Seongnam (KR); Chang il Kim, Cheongju (KR)

(73) Assignee: SK Hynix, Inc., Icheon (KR)

( * ) Notice: Subject to any disclaimer, the term of this patent is extended or adjusted under 35 U.S.C. 154(b) by 0 days.

(21) Appl. No.: 14/176,026

(22) Filed: Feb. 7, 2014

(65) Prior Publication Data

US 2015/0029805 A1    Jan. 29, 2015

(30) Foreign Application Priority Data

Jul. 23, 2013  (KR) .......................... 10-2013-0086817

(51) Int. Cl.
*G11C 5/06* (2006.01)
*G11C 5/02* (2006.01)
*G11C 5/14* (2006.01)

(52) U.S. Cl.
CPC ... *G11C 5/02* (2013.01); *G11C 5/14* (2013.01)
USPC .. 365/51; 365/63; 257/E27.013; 257/E29.026

(58) Field of Classification Search
USPC ............................................................ 365/51
See application file for complete search history.

(56) References Cited

U.S. PATENT DOCUMENTS

| | | | |
|---|---|---|---|
| 6,038,159 A * | 3/2000 | Raad | 365/51 |
| 7,894,033 B2 * | 2/2011 | Matsuura | 349/149 |
| 8,107,312 B2 * | 1/2012 | Park et al. | 365/51 |
| 8,461,697 B2 * | 6/2013 | Nozoe | 257/786 |
| 2003/0067066 A1 * | 4/2003 | Kondou | 257/691 |
| 2003/0209721 A1 | 11/2003 | Inoue | |
| 2004/0006754 A1 * | 1/2004 | Sonohara | 716/8 |
| 2006/0131726 A1 | 6/2006 | Bruch | |
| 2010/0117081 A1 | 5/2010 | Obuchi et al. | |

FOREIGN PATENT DOCUMENTS

| | | |
|---|---|---|
| JP | 1995-273119 A | 10/1995 |
| JP | 2003-323130 A | 11/2003 |
| JP | 2010-118428 A | 5/2010 |

* cited by examiner

*Primary Examiner* — Son Mai

(57) ABSTRACT

A semiconductor memory device includes a plurality of first regions formed in a line-type and extending in a first direction, and a plurality of second regions and a plurality of third regions arranged between adjacent first regions in a zigzag manner.

11 Claims, 3 Drawing Sheets

SEMICONDUCTOR MEMORY DEVICE

CROSS-REFERENCE TO RELATED APPLICATION

This application claims priority to Korean patent application No. 10-2013-0086817, filed on Jul. 23, 2013, which is hereby incorporated in its entirety by reference herein.

BACKGROUND

Embodiments relate to a semiconductor memory device, and more particularly to a semiconductor memory device in which a drive region coupled to a power source is extended into an adjacent dummy region.

Semiconductor memory devices have been widely used in various electronic appliances. The design of a semiconductor memory device aims to improve the operation speed of the device as well as to implement its miniaturization.

There are various methods for implementing miniaturization of semiconductor memory devices. With regard to the various implementation methods, improving arrangement of constituent elements of the semiconductor memory device has been discussed as a major issue.

SUMMARY

Various embodiments are directed to providing a semiconductor memory device that substantially addresses one or more issues of the related art.

An embodiment of the present disclosure relates to a semiconductor memory device appropriate for mobile electronic devices, including an improved layout of the semiconductor memory device that extends the degree of freedom in semiconductor design and improves the degree of integration of the semiconductor memory device.

An embodiment of the present disclosure relates to a semiconductor memory device configured to use a dummy region as a space for forming a driver so as to increase the degree of integration.

In accordance with an embodiment, a semiconductor memory device includes a plurality of first regions formed in lines extending in a first direction, and second and third regions arranged between adjacent first regions in a zigzag manner.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features will become apparent by reference to the following detailed description when considered in conjunction with the accompanying drawings.

DESCRIPTION OF EMBODIMENTS

Reference will now be made in detail to certain embodiments of the present disclosure, examples of which are illustrated in the accompanying drawings. Wherever possible, the same reference numbers will be used throughout the drawings to refer to the same or like parts.

Specific structural and functional descriptions are disclosed herein for illustrative purposes, and embodiments of the present disclosure can be implemented in various ways.

Figure 1:
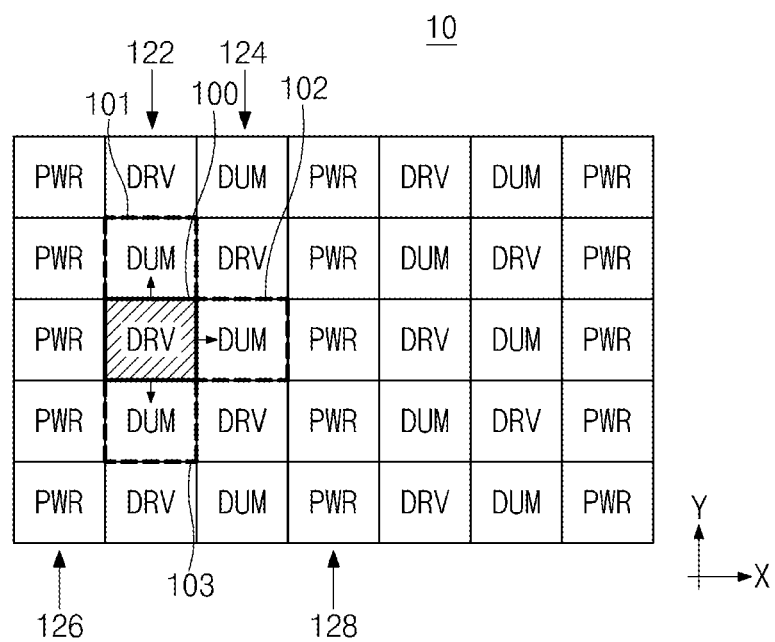
FIG. 1 is a conceptual diagram illustrating arrangement of a semiconductor memory device according to an embodiment.

FIG. 1 is a conceptual diagram illustrating arrangement of a semiconductor memory device according to an embodiment.

Referring to FIG. 1, the semiconductor memory device 10 may include a power region (PWR) including a power rail providing a power-supply voltage; and a drive region (DRV) that utilizes the power-supply voltage.

The power region (PWR) is arranged in a line shape. In an embodiment shown in FIG. 1, the power region (PWR) is continuously extended in a Y-direction, the plurality of power regions (PWRs) extended in the Y-direction is arranged in a line shape. However, other embodiments are possible, and the plurality of power region (PWRs) can also be extended to an X-axis or a diagonal direction as desired.

The drive region (DRV) is arranged between the power regions (PWRs), e.g., two columns of power regions (PWRs) extending in the Y-direction. In an embodiment, unlike the power region (PWR) that is continuously arranged in the Y-direction, a plurality of drive regions (DRVs) are alternated with dummy regions (DUMs) between adjacent power regions (PWRs), such that the drive regions (DRVs) are arranged in a zigzag manner.

In an embodiment, first and second columns 122 and 124 of alternating DRV-DUM regions are provided between two neighbor columns 126 and 128 of power regions (PWRs). In other embodiments, the number of columns of alternating DRV-DUM regions may be different than two, e.g., three or four. Similarly, the columns 122, 124, 126, and 128 may be implemented horizontally, diagonally, or the like according to implementation.

In an embodiment, dummy regions (DUMs) are incorporated between the drive regions (DRVs) to provide an additional area for use in implementing a large drive element of a drive region (DRV), as explained below. The dummy regions may also be used to improve the manufacturability of the device. For example, a dummy region may include structures that enhance a Chemical-Mechanical Polishing (CMP) step of a manufacturing process by creating a more uniform pattern density.

At least some components of the drive regions (DRVs) are coupled to the power region (PWR), and function upon receiving the power-supply voltage. Accordingly, the drive regions (DRVs) are located adjacent to the power regions (PWRs) and are electrically coupled to the power regions (PWRs).

The power region (PWR), the drive region (DRV), and the dummy region (DUM) may be defined in which one or more bumps configured to perform respective functions are formed. For example, the power region (PWR) may be composed of one or more bumps for applying or outputting power source, the drive region (DRV) may be composed of one or more bumps for applying or output driving voltage.

The bumps are conductive components that may be used to make electrical contacts between external nodes and the internal circuits of the semiconductor memory device. An example of such bumps are small metal balls that are formed on contact pads on the surface of a flip-chip IC and used to make external connections. As used herein, the "bumps" are used to refer to the contact pads or to the bumps formed on the contact pads, or both according to the implementation being described. The arrangement of the bumps and of the regions associated with the bumps may vary according to the design of the semiconductor memory device.

The drive elements contained in the drive regions (DRVs) may have different sizes according to their design characteristics. For example, a drive region (DRV) of the semiconductor memory device 10 that is coupled to an external node via a bump may include a drive element having a size different from a size of a corresponding drive element of another drive region (DRV) connected to an inner node of the semiconductor memory device 10.

In an embodiment, each drive element includes a terminal that is coupled to the drive region (DRV). If a size of the drive element is greater than that of the drive region (DRV), a dummy region (DUM) adjacent to that drive region to implement the drive element rather than using non-dummy regions such as a power region PWR. However, if the dummy region (DUM) is formed in only one direction, design extensibility of the drive region (DRV) is could be constrained.

The semiconductor memory device will hereinafter be described with reference to the drive region 100 of FIG. 1. When the number or size of drive elements contained in the drive region 100 increases, another region such as first to third dummy regions (101, 102, 103) adjacent to the drive region (DRV) 100, may be utilized.

The drive region 100 may be extended not only to the adjacent power region (PWR) but also to the dummy regions (DUMs) adjacent in three directions. The dummy regions (101, 102, 103) adjacent to the drive region 100 includes dummy regions (DUMBs) adjacent in both the X-direction (e.g., first direction) and the Y-direction (e.g., second direction), and therefore the degree of freedom available for extending the drive region 100 is increased.

When drive elements of the drive region 100 are arranged in the X-direction, the drive elements may be extended to the second dummy region 102 adjacent to the drive region 100. However, if the second dummy region 102 is not available for extending the drive region 100 (e.g., if only one column of dummy regions is provided between the neighbor columns of power regions), the first dummy region 101 or the third dummy region 103 would need to be utilized for implementing the drive element for the drive region 100. In order to extend the X-directional drive elements to Y-directional drive elements, additional fingering, that is, the providing of additional drive elements connected together to form the gate of the drive region 100, may be needed. In addition, additional wiring for connection may be required. Because additional drive elements and/or wiring may be required, a region needing such an extension may be inappropriate for miniaturization of the semiconductor memory device.

Accordingly, in an embodiment, the semiconductor memory device 10 arranges the drive regions (DRVs) and the dummy region (DUMs) in a zigzag manner, such that the drive elements (DRVs) can be extended in either of the X and Y directions.

Figure 2:
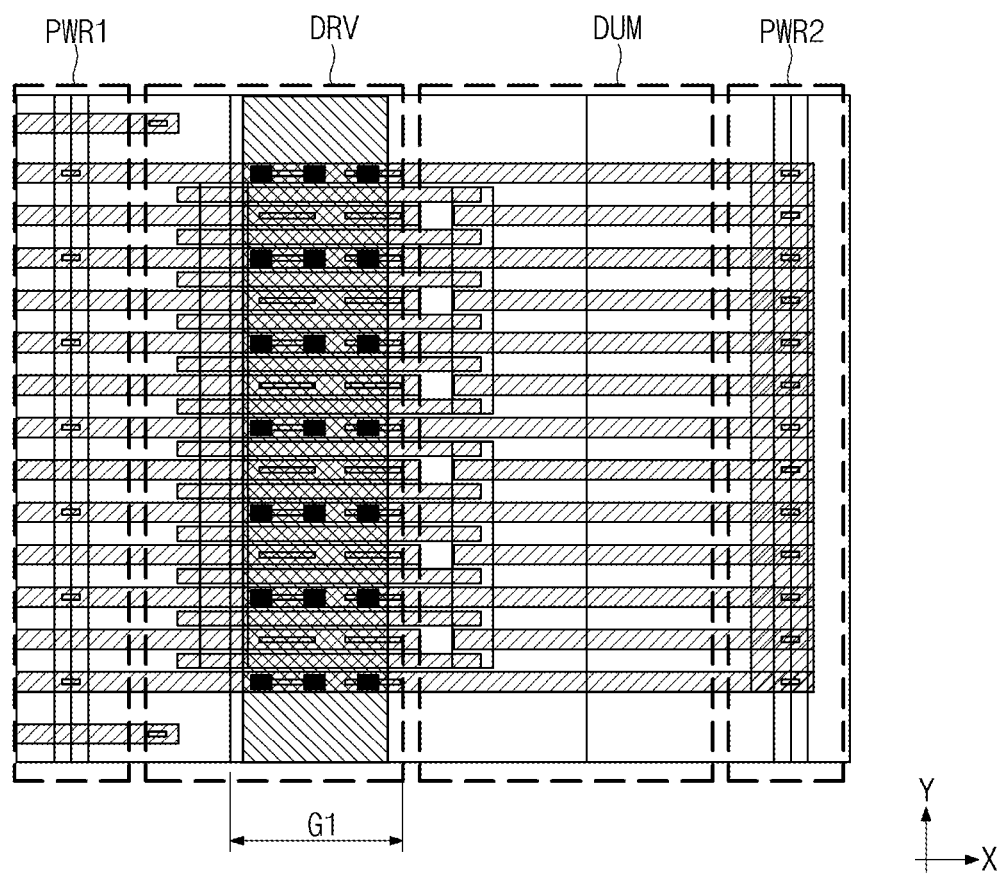
FIGS. 2 and 3 are layout diagrams illustrating examples of extending a drive region contained in the semiconductor memory device shown in FIG. 1.
Figure 3:
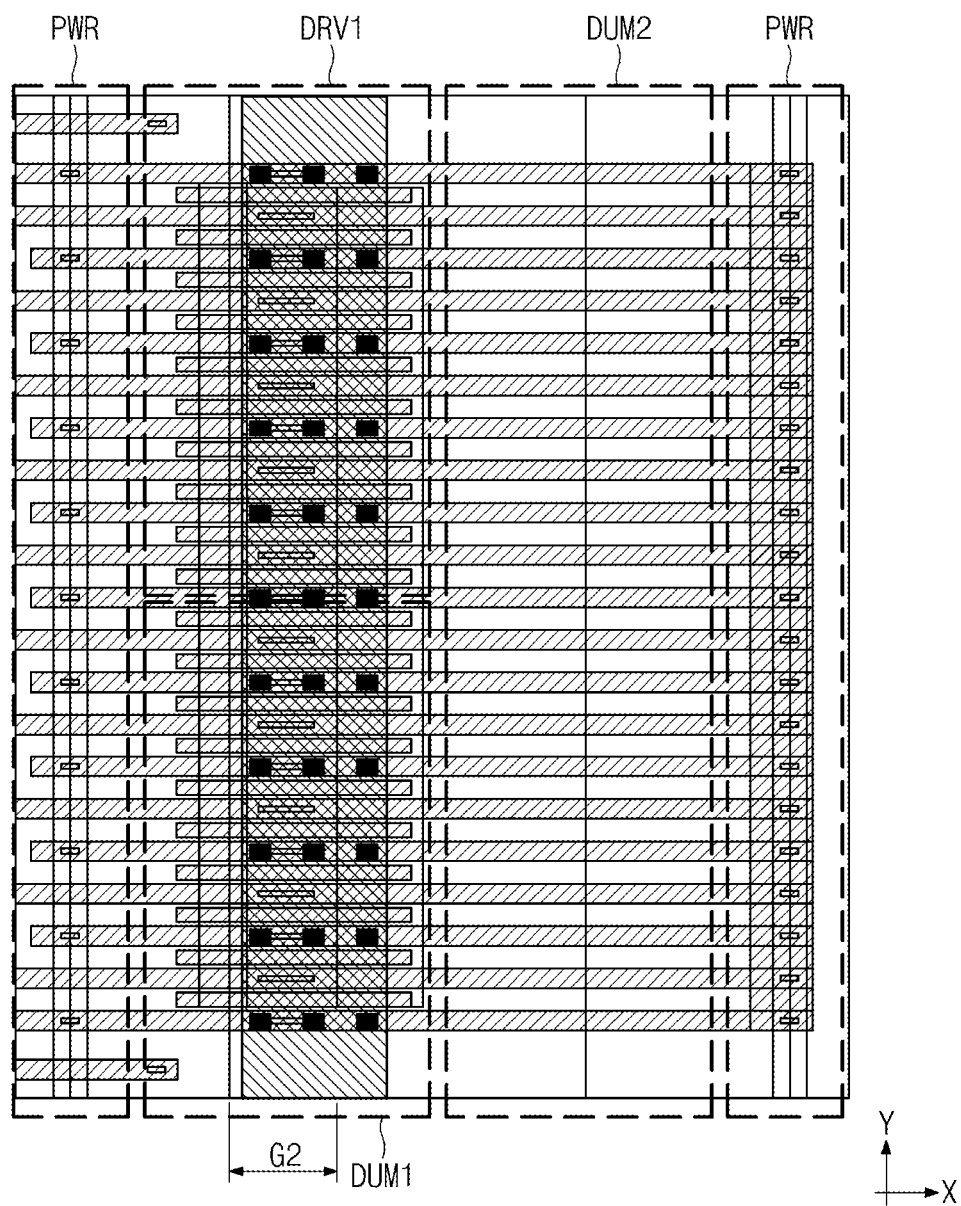

FIGS. 2 and 3 are layout diagrams illustrating examples of extending a drive region contained in the semiconductor memory device 10 shown in FIG. 1.

FIG. 2 shows drive elements connected to a drive region (DRV) expanded to the X-direction and FIG. 3 shows another drive elements connected to another drive region (DRV) expanded to the Y-direction, each implementing the same drive capability. For convenience of description and better understanding of these embodiments, FIGS. 2 and 3 show the power regions (PWRs) and one drive region (DRV).

Referring to FIG. 2, the power region (PWR) extending in the Y-direction is electrically coupled to the drive elements contained in the drive region (DRV). The drive elements are formed to have a larger size than the drive region (DRV), so that the scope of the drive elements is extended into the dummy region (DUM) located to the right of the drive region (DRV). FIG. 2 shows the case in which the drive elements of the drive region (DRV) extend along the X-direction. Referring to FIG. 3, the power region (PWR) extending along the Y-direction is electrically coupled to drive elements of the drive region (DRV1) in substantially the same manner as in FIG. 2. However, the drive elements contained in the drive region (DRV1) exceeds the scope of the drive region (DRV1) and are extended to the upper and lower parts of the dummy region (DUM1) below the drive region (DRV1). FIG. 3 shows an exemplary case in which drive elements of the drive region (DRV1) extends along the Y-direction.

Accordingly, a gate width (G1) of the drive elements shown in FIG. 2 is longer than a gate width (G2) of the drive elements shown in FIG. 3, gate width being measured in a direction perpendicular to the flow of current in the channel controlled by the gate. However, the number of drive elements of FIG. 2 is lower than that of drive elements of FIG. 3. As a result, because drive capability is proportional to the sum of the gate widths of the drive elements, substantially the same drive capability can be achieved in the exemplary cases of FIGS. 2 and 3 wherein the drive elements are extended to the X- or Y-direction, respectively.

Assuming that the drive elements have a short gate width and need to be extended to the Y-direction (without extending to the X-direction as shown in FIG. 2), fingering should be vertically extended so that additional drive elements are arranged in the Y-direction. In contrast, if it is difficult for the drive elements to be extended to the Y-direction although a gate width of the drive elements should be extended as shown in FIG. 3, each gate of the drive elements may be intermediately curved or bent.

In accordance with embodiments of the present disclosure, if the drive regions (DRVs) and the dummy regions (DUMs) are arranged in a zigzag manner as shown in FIG. 1, the drive regions (DRVs) can be extended in the X-direction and Y-direction. Therefore, these embodiments can selectively use a method for increasing the gate width of each drive element or a method for increasing the number of drive elements, thereby increasing the degree of freedom in semiconductor design.

As described above, the drive elements in the drive region (DRV) of the semiconductor memory device according to an embodiment can be coupled to the power region (PWR) and can also be freely extended. Therefore, the semiconductor memory device according to this embodiment can guarantee drive capability and can effectively utilize an already available space, so that the semiconductor memory device can be compatible with small-sized devices.

According to an embodiment, a semiconductor memory device is configured to adjust the arrangement of the dummy regions, resulting in increased freedom in semiconductor design.

Embodiments may be carried out in other ways than those specifically described herein. Embodiments are construed as illustrative and not restrictive.

Variations and modifications are possible in the component parts and/or arrangements in the disclosure, and the drawings. Alternative uses are possible.

What is claimed is:

1. A semiconductor memory device comprising:
a plurality of first regions formed in a line shape and extending in a first direction; and
a plurality of second regions and a plurality of third regions arranged to form a zigzag pattern between adjacent first regions.

2. The semiconductor memory device according to claim 1, wherein each first region corresponds to a power region configured to provide a power-supply voltage.

3. The semiconductor memory device according to claim 2, wherein at least one second region includes a drive region having one or more drive elements receiving the power-supply voltage, and at least one third region includes a dummy region into which the at least one second region is extended.

4. The semiconductor memory device according to claim 3, wherein the at least one third region includes a first dummy region adjacent to the at least one second region in the first direction, and a second dummy region adjacent to the at least one second region in a second direction different from the first direction.

5. The semiconductor memory device according to claim 3, wherein extending the at least one second region includes increasing a number of the drive elements.

6. The semiconductor memory device according to claim 3, wherein extending the at least one second region includes increasing a gate width of at least one of the drive elements.

7. The semiconductor memory device according to claim 4, wherein the second direction is orthogonal to the first direction.

8. The semiconductor memory device according to claim 1, wherein at least one of the first regions, second regions, or third regions is connected to an external part through a bump.

9. A semiconductor memory device comprising:
   a plurality of first power regions defining in a first line shape and extending in a first direction;
   a plurality of second power regions defining in a second line shape and extending in the first direction spaced apart from the first power regions;
   a plurality of drive regions defining a zigzag pattern between the first and second power regions,
   wherein the power regions are configured to supply a power-supply voltage and the drive regions are configured to receive the power-supply voltage from the power regions.

10. The semiconductor memory device according to claim 9, wherein the drive regions define the zigzag pattern by having an alternating pattern with dummy regions.

11. The semiconductor memory device according to claim 10, wherein the plurality of the drive regions includes a drive element that extends into at least one dummy region.

\* \* \* \* \*